United States Patent
Davis et al.

(10) Patent No.: US 7,898,203 B2
(45) Date of Patent: Mar. 1, 2011

(54) SYSTEMS AND METHODS FOR DYNAMICALLY COMPENSATING MOTOR RESISTANCE IN ELECTRIC MOTORS

(75) Inventors: Marc R. Davis, Dublin, CA (US); Andrew J. Shepherd, Danville, CA (US); Stephen Post, Walnut Creek, CA (US)

(73) Assignee: Curtis Instruments, Inc., Livermore, CA (US)

( * ) Notice: Subject to any disclaimer, the term of this patent is extended or adjusted under 35 U.S.C. 154(b) by 490 days.

(21) Appl. No.: 12/172,139

(22) Filed: Jul. 11, 2008

(65) Prior Publication Data
US 2010/0007299 A1 Jan. 14, 2010

(51) Int. Cl.
*G01R 31/34* (2006.01)
(52) U.S. Cl. .......... 318/490; 318/473; 318/558; 318/139
(58) Field of Classification Search .................. 318/139, 318/366, 471, 473, 490, 558, 700
See application file for complete search history.

(56) References Cited

U.S. PATENT DOCUMENTS

| | | | | |
|---|---|---|---|---|
| 4,829,234 A * | 5/1989 | Gretsch | .................... | 324/765.01 |
| 6,111,330 A * | 8/2000 | Lochmahr et al. | .......... | 310/68 C |
| 7,026,776 B1 * | 4/2006 | Walters | ......................... | 318/434 |
| 2003/0034793 A1 * | 2/2003 | Lee et al. | ...................... | 324/772 |
| 2005/0189893 A1 * | 9/2005 | Boscolo et al. | ................ | 318/270 |
| 2010/0194329 A1 * | 8/2010 | Lu et al. | ........................ | 318/798 |

* cited by examiner

*Primary Examiner* — Bentsu Ro
(74) *Attorney, Agent, or Firm* — Beyer Law Group LLP

(57) ABSTRACT

Electric motor controllers that dynamically adjust a motor resistance parameter are described. In order to adjust the motor resistance parameter, power is applied the electric motor while the controlled vehicle is stopped and its brake is set so that the vehicle remains stopped while a measurement is taken that can be used to determine motor resistance. A new motor resistance value is then generated based at least in part upon the measurement(s) and the motor resistance parameter is set to the new motor resistance value. The new motor resistance parameter may then be used in the control of the electric motor. In some embodiments, the measurements are taken after the controller receives a brake release request but before actually releasing the brake. The described arrangement can be used in a wide variety of motor controllers and is especially well suited for use in low cost controllers that control motors that are susceptible to wide variations in their resistance such as brushed permanent magnet DC motors.

23 Claims, 3 Drawing Sheets

SYSTEMS AND METHODS FOR DYNAMICALLY COMPENSATING MOTOR RESISTANCE IN ELECTRIC MOTORS

BACKGROUND OF THE INVENTION

1. Field of the Invention

The present invention relates generally to systems and methods of controlling electric motors. More particularly, the present invention relates to an electronic motor controller that dynamically adjusts a motor resistance parameter used in the control of an electric motor.

2. Description of the Related Art

Electric motors are used in a wide variety of applications. When electric motors are used to drive a vehicle, they are typically controlled by an electric motor speed controller. Generally, a design goal for such motor speed controllers is to control the operational characteristics of the motor so that the motor consistently operates smoothly and safely in a manner that provides a comfortable feel for the operator.

In order to properly control an electric motor, many motor controllers store a set of motor parameters that characterize the electric motor being controlled. The motor controller uses these motor parameters to translate user input into control signals for the electric motor. One motor parameter that is frequently used by the controller is the resistance of the motor. Knowing the resistance of the motor may be useful in a number of control applications. For instance, the motor resistance may be combined with the current and voltage to estimate the speed of the motor—which is particularly useful in vehicles that don't have speedometers to directly measure their speed.

In some motor speed controllers, the resistance of the motor used by the motor controller is a set value. The set resistance value may be a resistance value provided by the motor manufacturer (typically available on a data sheet) or the vehicle manufacturer (typically determined experimentally). However, this set resistance value does not always accurately represent the actual resistance of the motor. For instance, the actual motor resistance may fluctuate during operation based on operating characteristics such as on the temperature of the motor. It is generally known that a direct relationship exists between the resistance and temperature of the motor. As the motor increases in temperature during operation, the resistance of the motor will also increase. Similarly, as the motor decreases in temperature, the resistance of the motor will also decrease. Factors that may lead to temperature fluctuations in the motor include the load applied to the motor. For example, the motor temperature may increase as the vehicle travels up a hill and decrease when the vehicle remains stationary or is lightly used. For these reasons, the resistance of the motor may fluctuate during operation. In some applications the operational resistance fluctuations can be quite dramatic. For example, in small, low cost, brushed permanent magnet DC motors often used in electric scooter and electric wheelchair applications, the actual resistance of the motor can vary dramatically during operation—which can have a very significant impact on performance when motor resistance is used as motor speed control parameter.

In order to address this issue, attempts have been made to estimate or calculate the resistance of the motor and to adjust the motor resistance parameter accordingly. One way to estimate the operational variations in resistance is to measure the actual motor temperature. This generally works satisfactorily because the relationship between motor resistance and temperature is generally known. However, the need to measure motor temperatures adds costs and complexity to both the motor and controller design. For example, the additional sensors required to measure motor temperature are not desirable since they represent potential points for failure and added cost.

Of course, the problem of speed control may be addressed in motor controllers through a variety of other methods as well. For example, speedometers may be used to measure the actual vehicle speed. However, these options are generally more costly and/or require additional hardware. Therefore, it would be beneficial if a cost sensitive mechanism were created to account for motor or vehicle operating characteristics that vary over time or otherwise occur after initial production of the vehicle. Similarly, it would be desirable if a cost sensitive mechanism were capable of dynamically adjusting the motor resistance parameter stored in the motor controller in response to measurements received from the motor during operation.

SUMMARY OF THE INVENTION

To achieve the foregoing and other objects of the invention, electric motor controllers that dynamically adjust a motor resistance parameter are described. In order to adjust the motor resistance parameter, power is applied to the electric motor while the controlled vehicle is stopped and its brake is set so that the vehicle remains stopped while at least one measurement is taken that can be used to determine motor resistance. A new motor resistance value is then generated based at least in part upon the measurement(s) and the motor resistance parameter is set to the new motor resistance value. The new motor resistance parameter may then be used in the control of the electric motor.

In some embodiments, the measurements are taken after the controller receives a brake release request but before actually releasing the brake. The described arrangement can be used in a wide variety of motor controllers and is especially well suited for use in low cost controllers that control motors that are susceptible to wide variations in their resistance such as brushed permanent magnet DC motors.

The measurements may be taken in a variety of different manners. In some embodiments, voltage is applied to the electric motor in a manner that ramps the motor current to a stable current level and the measurements (which may simply be measurement of the voltage and/or current) are collected after the motor reaches the stable current level. After the measurements are collected, the voltage applied to the motor may be reduced such that the current flowing through the motor is reduced prior to releasing the brake. For example, in some implementations suitable for relatively small brushed permanent magnet DC motors, stable current level in the range of 10 to 30 amps may be suitable for facilitating the measurements and it may be desirable to reduce the current to zero prior to releasing the brake.

The value used as the new motor resistance parameter may be calculated or determined in a variety of ways. In some implementations the measured value itself may be used as the motor resistance parameter, but in many others it may be preferable to impose certain constraints on the range of permissible resistance values or the amount of change in resistance values that are permissible or desirable. For example, in some embodiments, the new motor resistance value may be based on a weighted combination of the measured motor resistance value and the present value of the motor resistance parameter. In some implementations, the weighting of the resistance values may be dependent upon the amount of time that has passed since the value of the motor resistance parameter was last set (e.g., the longer it has been since the motor resistance parameter has been set, the more weighting is applied to the newly measured value).

In some embodiments, the electric motor controller may have a minimum permissible resistance value and a maximum permissible resistance value and/or the new motor resistance value may be constrained to a value within a predetermined range relative to the present value of the motor resistance parameter.

The described motor controllers and resistance determining methods may be employed in a wide variety of motor controllers used to control a wide variety of different types of electric motors which may be used in a wide variety of different vehicles.

BRIEF DESCRIPTION OF THE DRAWINGS

The invention and the advantages thereof, may best be understood by reference to the following description taken in conjunction with the accompanying drawings in which.

DETAILED DESCRIPTION OF THE INVENTION

In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

The present invention is designed for use in an electric motor controller. As will be described with reference to the following figures, a variety of mechanisms are disclosed for dynamically adjusting a motor resistance parameter stored within an electric motor controller that is used in controlling an electric motor. More particularly, the present invention enables dynamic adjustment of a motor resistance parameter stored within an electric motor controller. The adjustments are based upon measurements taken while operating the motor with the brake engaged. Dynamic adjustment of the motor resistance parameter enables the motor controller to compensate for changes in the motor resistance that may interfere with the control of the motor. For example, the motor controller may compensate for motor characteristics such as motor resistance that change over the lifespan of the motor or change during the operation of the motor. As a result, the motor controller is able to more accurately control the motor without requiring the user to continually and consciously modify his or her input to compensate for changes in the motor performance.

Figure 1:
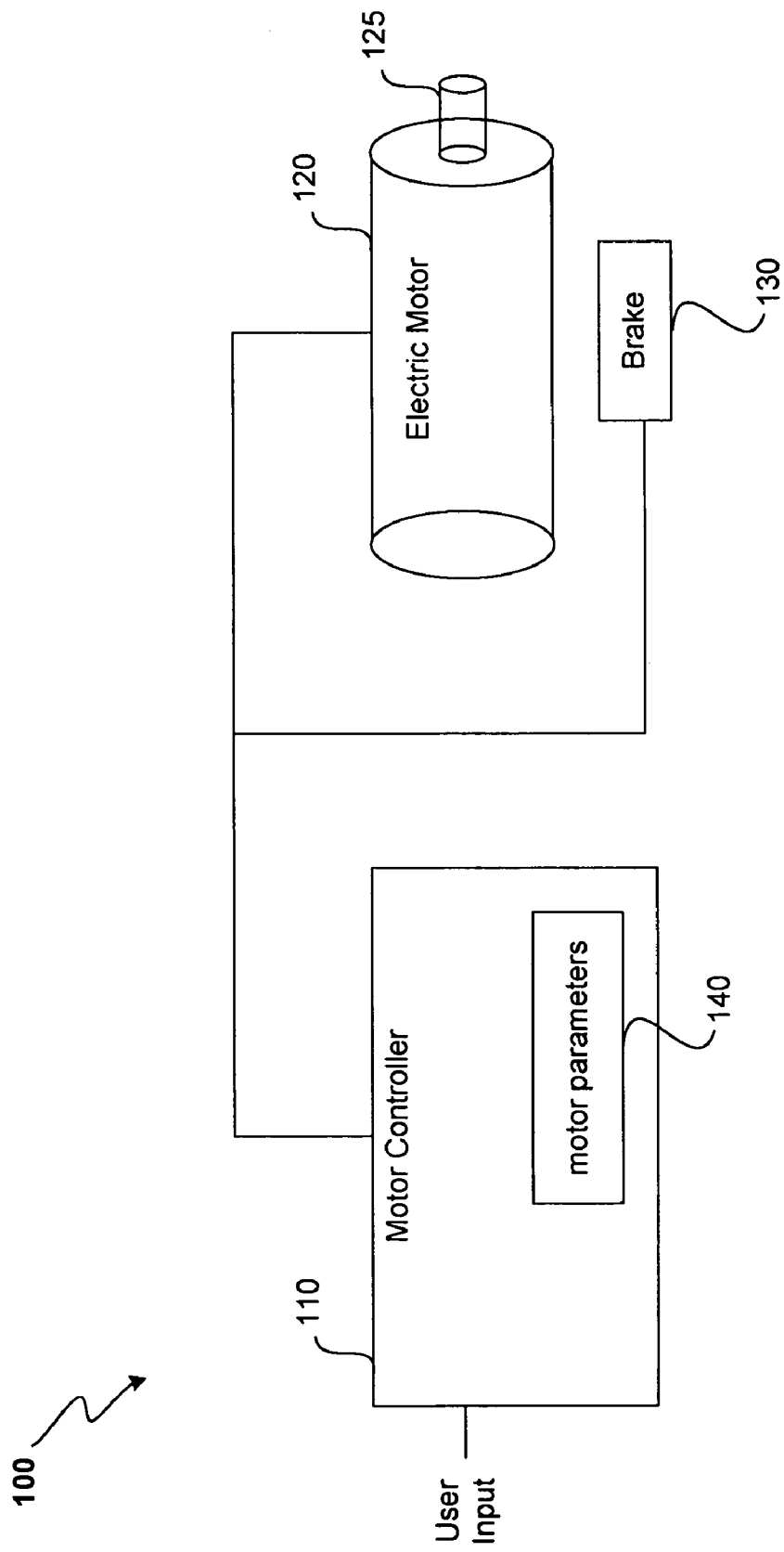
FIG. 1 is a system diagram illustrating a system for driving a vehicle in accordance with one embodiment of the present invention.

FIG. 1 is a system diagram illustrating a system for driving a vehicle in accordance with one embodiment of the present invention. Exemplary vehicles include motorized wheelchairs, scooters, carts, forklifts, and other electrically powered vehicles. The drive system includes an electric motor 120 and motor controller 110 that controls operations of the electric motors. In the described embodiments, a motor resistance parameter stored within motor controller 110 is automatically and dynamically adjusted to compensate for changes within electric motor 120. Changes within electric motor 120 may be caused from the fluctuation of motor characteristics during normal use or degradation of motor components through the life of the motor. The motor controller may also sense a change in motor characteristics when a worn electric motor is replaced with a new electric motor.

In this embodiment, system 100 is located within a vehicle (not shown). Electric motor controller 110 is coupled to electric motor 120 for controlling the electric motor. In one example, electric motor 120 is a brushed permanent magnet DC motor. Generally, brushed permanent magnet DC motors develop a motor torque that is proportional to the current level and magnetic flux of the motor. The current level is created by the voltage applied to the motor while the magnetic flux is established by the magnetic field of the motor. Motor characteristics such as resistance dictate the performance of the motor by changing the amount of torque generated for a given current level. Since torque is a direct function of current, the amount of torque that the motor applies to shaft 125 is dependent on the voltage applied to the motor. Shaft 125 may be coupled to a variety of objects for driving or otherwise operating the vehicle. In one example, shaft 125 is coupled directly or indirectly to one or more wheels of the vehicle. Depending upon the amount of torque applied to the shaft, the wheels will eventually reach a threshold velocity and the vehicle will reach a certain speed.

Electric motor controller 110 is further coupled to brake 130. In one example, brake 130 is an electromagnetic brake. When brake 130 is triggered by motor controller 110, the brake is applied in a manner that restrains the vehicle from movement. Generally, it is desirable for brake 130 to be applied when the vehicle is stopped (i.e. at zero speed). Braking when the vehicle is not stopped accelerates brake wear and decreases the user's control over the vehicle. This may lead to unpredictable behavior. For example, applying the brake while the vehicle is moving forward may cause the wheels to lock and the vehicle to skid into a stop. During the skid, the user may experience a lack of control over the vehicle.

During operation, the user may input a desired speed of the vehicle to system 100. Motor controller 110 receives this user input and calculates the appropriate amount of power that should be applied to electric motor 120 in order to reach the desired speed. This calculation requires knowledge of some characteristics of electric motor 120. For example, many speed control applications require the resistance of the motor. The motor resistance parameter allows the motor controller to calculate the appropriate compensation such that the electric motor tightly tracks the user's desired speed. A copy of these motor characteristics is stored in electric motor parameters 140 located within motor controller 110.

Once the appropriate amount of power is calculated, motor controller 110 applies the power to electric motor 120. In electric motors such as brushed permanent magnet DC motors, this power may be applied as a voltage level from a power source coupled to motor controller 110 or to electric motor 120. The voltage applied to electric motor 120 creates current while the permanent magnets establish a magnetic field. Subsequently, a motor torque is developed that is proportional to the current and the magnetic flux. Assuming the resistance value stored within motor parameters 140 accurately represents the present state of electric motor 120, the vehicle will travel at a speed that is substantially near the speed requested by the user. However, if the resistance value is not accurately represented by motor parameters 140, the vehicle's actual speed may not meet user expectations and as a result, the user may find himself continually adjusting the desired speed of the vehicle in an attempt to compensate for the difference. Furthermore, the vehicle may not actually be at zero speed when the brake is applied, thereby decreasing or reducing the user's control over the vehicle and compromising vehicle feel. Therefore, the ability of motor parameters 140 to accurately portray the present state of electric motor 120 is important for precise motor speed control.

In accordance with one embodiment of the present invention, motor controller 110 is configured to perform a recalibration test. More specifically, motor controller 110 may dynamically adjust motor parameters 140 to more accurately represent the present state of electric motor 120 anytime the vehicle is stopped and brake 130 is applied. By remaining stopped during the recalibration test, the effects of motor characteristics such as back-EMF are negated, thereby simplifying the calculations. In a preferred embodiment, the recalibration test is performed between the time when motor controller 110 receives an input from the user that the brake should be released and the time when brake 130 is actually released. This improves the accuracy of motor parameters 140 by minimizing the period of time between the adjustment of motor parameters 140 and the operation of the vehicle. For example, the motor resistance when the vehicle stops after climbing a hill may vary greatly from the motor resistance when the vehicle has remained idle for a long period of time. Therefore, the actual motor parameters may be more accurately represented if the test is performed prior to releasing the brake rather than when the vehicle has first stopped. In one example, the recalibration test may be performed within 1/10th to 1/4th of a second.

Motor controller 110 includes at least two arrangements for performing the recalibration test. The first arrangement is suitable for collecting one or more measurements from electric motor 120 and generating new motor parameters that include at least a motor resistance parameter. The one or more measurements are collected during a measurement period where the vehicle remains stopped with the brake set. The second arrangement automatically sets motor parameters 140 to the generated motor parameters. With respect to the first arrangement, voltage is applied to electric motor 120 in a manner that ramps the current in electric motor 120 to a stable current level. Once the current is stable at the current level, the first arrangement collects one or more measurements of the voltage value being applied to electric motor 120. The combination of the voltage measurements and the current threshold may then be used to calculate the resistance in electric motor 120. After the measurements are made, the voltage applied to the motor is reduced so that the current flowing through the motor is reduced prior to releasing the brake. In one example, the brake is released when the current measured through electric motor 120 reaches zero.

In one embodiment, it is desirable to set the stable current level at a high threshold in order to improve the accuracy of the calculated motor resistance. A higher stable current level means a higher applied voltage, thereby resulting in a more accurate calculated motor resistance since larger current and voltage values are used in the calculation. This is an important consideration when the size of the motor is small. Small motors generally have larger temperature fluctuations and therefore require better compensation for changes in motor resistance. In one example, it is preferable to use a stable current level between 10-30 amps when the actual motor resistance is between 50-400 milliohms. However, it is also necessary to set an upper limit to the stable current level in order to prevent electric motor 120 from overpowering the brakes and placing the vehicle in motion. A moving vehicle may complicate the motor resistance calculations with motor characteristics such as back-EMF.

Once the recalibration test has been successfully executed, motor parameters 140 will store a new resistance value that approximates the present state of electric motor 110. This new resistance value may be used by motor controller 110 to control electric motor 120. In some embodiments, the new resistance value may additionally or alternatively be used to extrapolate an estimation of the motor's temperature. Since the relationship between temperature and resistance of the motor is known, the temperature of the motor may be calculated with the new resistance value. This may be useful in monitoring motor temperatures.

It is to be understood that the recalibration test described above may be applied to a variety of motors. For example, electric motor 120 may be a brushless permanent AC or DC motor, brushed DC series motor, brushed DC separately excited motor, or AC induction motors. Moreover, the components may be coupled through wired and wireless technologies.

Figure 2:
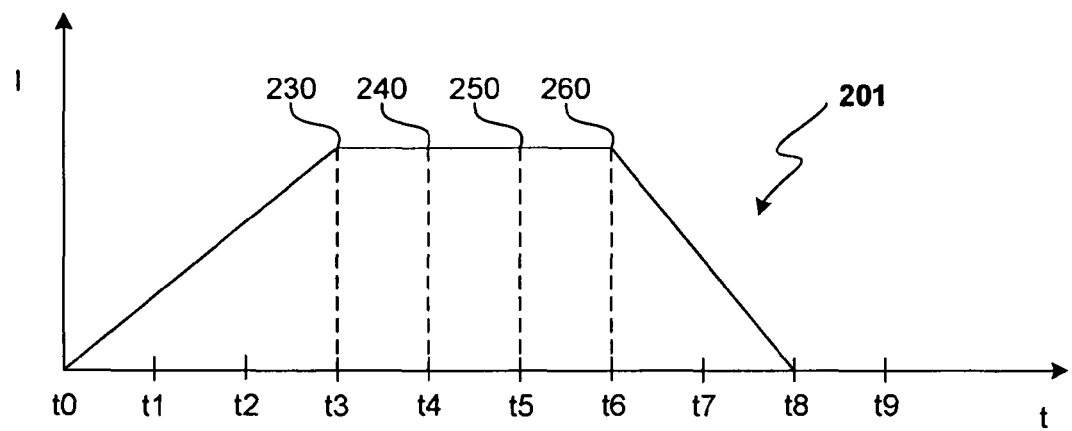
FIG. 2 contains two exemplary graphs illustrating the measurements collected for generating a new motor resistance value in accordance with one embodiment of the present invention.
Figure 2:
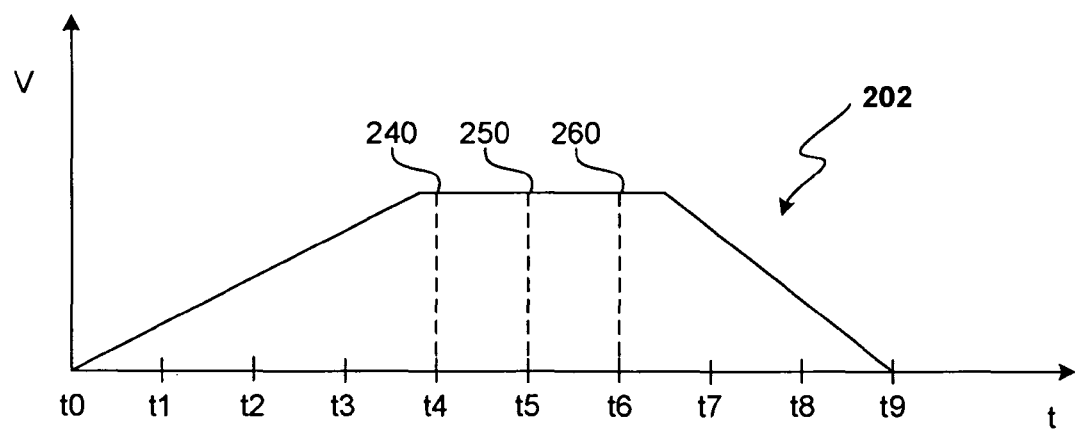

FIG. 2 contains two exemplary graphs illustrating the measurements collected for generating a new motor resistance value in accordance with one embodiment of the present invention. Graph 201 illustrates the current level within the electric motor while graph 202 illustrates the voltage level applied by the motor controller. Both of these graphs may be may monitored in the motor controller. At time 230, the current in the electric motor has reached the desired current level. As discussed above, the desired current level may be based upon the size of the electric motor and the quality of the brake. The motor controller may wait for a period of time after the current has reached the desired level for the motor to stabilize at the desired current level. This stabilization period may improve the accuracy of the measurements collected by allowing the voltage and current levels to stabilize from the process of reaching the desired current level. In this example, the stabilization period lasts for one clock cycle.

Once the current has stabilized, at least one voltage sample is collected from the motor controller for calculating a measured motor resistance value. Collecting multiple voltage samples may assist in minimizing the effects of the occasional inaccurate sample. For instance, the effects of inaccurate samples due to electrical noise in the current or voltage sensors may be mitigated by averaging the samples. Various averaging algorithms such as the mean, median, mode, or time-weighted averages (i.e. applying less weight to earlier collected samples) may be applied to minimize the effects of the inaccurate sample. In this example, three consecutive voltage samples are collected from clock cycles at time 240, 250, and 260 after the current has stabilized. Once the measurements are collected, the motor controller reduces the applied voltage until both the measured current and the applied voltage reach zero. The motor controller generates a measured motor resistance value by averaging the collected voltage samples.

Once the measured motor resistance value is determined, the new motor resistance value may be calculated. The new motor resistance value may simply be equal to the measured motor resistance value. Alternatively, the new motor resistance value may be calculated by combining the measured motor resistance value with other values. This may negate the effects of an inaccurately measured resistance value due to reasons such as the brushes of the motor stopping on the motor's commutator bar when the measurements are taken. Generally, it is desirable to decrease the possibility of overestimating the new resistance value. An overestimated resistance value may cause the motor controller to overestimate the applied voltage level and the speed of the vehicle. In one example, the new motor resistance value may be based upon a combination of a plurality of resistance values that include the measured motor resistance value and the present value stored within the motor controller.

In one embodiment, the combination of the measured resistance value and the present value stored within the memory controller are weighted. The weighting may depend at least in part on the amount of time that has passed since the present value was last set. In one example, the weight given to the present value stored in the motor controller follows a typical exponential decay graph. This places confidence in the present value if not much time has passed since it was last set. However, if a long period of time has passed since the present value was previously set, the present value may be given little to no weight.

Once the new motor resistance value is calculated, the new motor resistance value may be verified. In many embodiments it will be desirable to confine the new motor resistance value within a set of boundaries. In one example, the motor controller stores a minimum permissible resistance value and a maximum permissible resistance value. The new motor resistance value is set to a minimum permissible resistance value if the calculated new motor resistance value is less than the minimum permissible resistance value and the new motor resistance value is set to a maximum permissible resistance value if the calculated new motor resistance value is greater than the maximum permissible resistance value. This provides a safeguard against erroneously measured voltage samples and faulty calculations. In some embodiments, the new motor resistance value is additionally or alternatively constrained to a value within a predetermined range relative to a present value of the motor resistance parameter. As a result, fluctuations in the motor resistance parameter may be limited, thereby minimizing the effects of a poorly generated motor resistance value. In one example, the new motor resistance value can be a maximum of two times the present value and a minimum of one half times the present value. This range may be based upon the temperature characteristics of the materials used in the electric motor.

Figure 3:
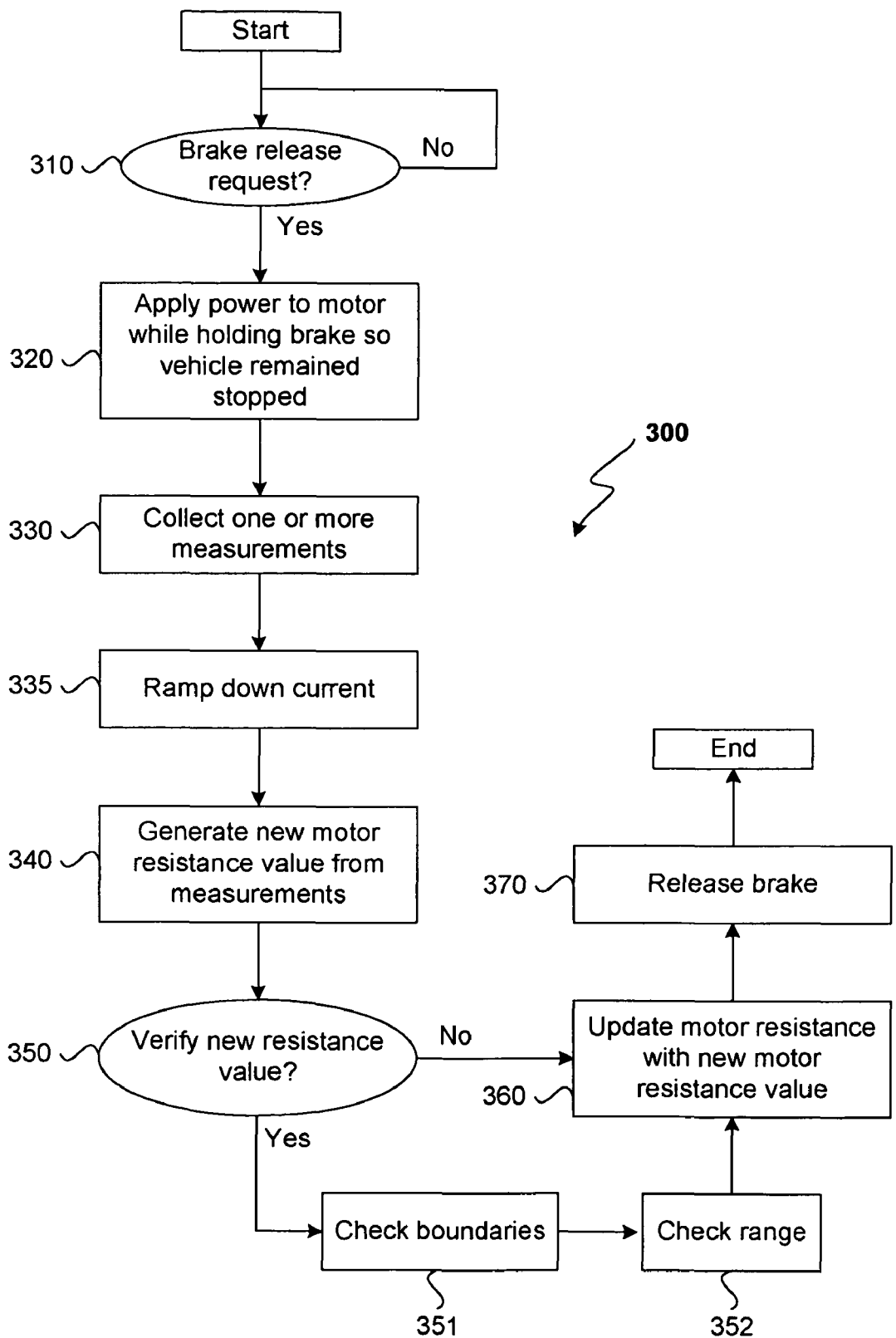
FIG. 3 is a process flow diagram illustrating a method of dynamically adjusting a motor resistance parameter in an electric motor controller in accordance with one embodiment of the present invention.

FIG. 3 is a process flow diagram illustrating a method of dynamically adjusting a motor resistance parameter in an electric motor controller in accordance with one embodiment of the present invention. In one embodiment, the electric motor controller is a brushed permanent magnet DC motor. Process flow 300 begins with the vehicle in a stopped position and the brake engaged. The electric motor and the motor controller may be in an idle state waiting for a command. At decision 310, the motor controller waits to receive a brake release request. In one example, the brake release request may be received from a user input. Once the brake release request has been received, the motor controller applies power 320 to the electric motor while holding the brake in a manner that allows the vehicle to remain stopped. This may involve applying voltage to the electric motor in order to ramp the current in the motor to a stable current level, wherein the stable current level does not overpower the brake's ability to hold the vehicle in a stopped position. In one example, the stable current level is in the range of 10 to 30 amps.

After the motor controller applies power 320 to the electric motor, one or more measurements are collected 330 from the electric motor. In one embodiment, these measurements are collected after the electric motor has reached a stable current level. After the measurements are collected 330, the power applied to the motor is reduced, thereby ramping down 335 the current in the electric motor. This may improve the feel to the user. In the alternative, the current may be ramped down anytime up to the point that the brake is released 370. In one example, the current is ramped down to zero prior to releasing the brake. Once the current has ramped down 335, the measurements are used to generate 340 a new motor resistance value. Generating a new motor resistance value involves calculating a measured motor resistance value from the measurements collected. The measured resistance value may subsequently be used in calculating the new motor resistance value. In one embodiment, the new motor resistance value is based on a combination of a plurality of resistance values that include the measured motor resistance value and a present value of the motor resistance parameter. These resistance values may be combined in a weighted or non-weighted fashion. If weighted, the weighting of the resistance values may depend at least in part on the amount of time that has passed since the present value of the motor resistance parameter was last set.

Decision 350 determines whether the new resistance value should be verified. If the new resistance value does not need to be verified, the motor resistance parameter within the motor controller is updated 360 with the new motor resistance value. On the other hand, if the new resistance value needs to be verified, various safeguards may be performed. Boundaries are checked 351 to ensure that the new motor resistance value falls within a set of boundaries. For example, the new motor resistance value is set to a minimum permissible resistance value if the new motor resistance value is less than the minimum permissible resistance value and the new motor resistance value is set to a maximum permissible resistance value if the new motor resistance value is greater than the maximum permissible resistance value. The range is also checked 252 to ensure that the new motor resistance value falls within a predetermined range relative to the present value of the motor resistance parameter.

Once the motor resistance parameter has been updated 360, the brake is released 370. It is noted that with additional information, the controller may release the brake earlier than illustrated in process flow 300. In one embodiment, estimates of the time required to perform some of the steps in process flow 300, including step 370, are used to minimize the execution time of process flow 300. For example, an estimate of the delay between when the brake release 370 is issued and when the brake is actually released may allow the controller to offset that delay by issuing the brake release command at an earlier time. Depending upon the estimates of time required to update the motor resistance 360 or verify the motor resistance 350, release brake 370 may be issued before these steps. In fact, brake release 370 may be issued anytime after the measurements have been collected. At the end of process flow 300, the motor controller provides power to the electric motor based on the new resistance value and places the vehicle in motion. The motor controller continues to use the new resistance value until the value is recalibrated the next time the vehicle is stopped with the brake set.

The controller of the present invention may generally be implemented on any suitable computer system (e.g., microprocessor). In addition, the present invention may be implemented as computer-readable instructions stored on any suitable computer-readable media.

Although illustrative embodiments and applications of this invention are shown and described herein, many variations and modifications are possible which remain within the concept, scope, and spirit of the invention, and these variations would become clear to those of ordinary skill in the art after perusal of this application. For instance, although the specification has described method of dynamically adjusting the motor resistance value stored within the motor controller, other parameters may also be dynamically adjusted. Moreover, the present invention may be used in a system employing a various types of motors. Accordingly, the present embodiments are to be considered as illustrative and not restrictive, and the invention is not to be limited to the details given herein, but may be modified within the scope and equivalents of the appended claims.

The invention claimed is:

1. A method for dynamically adjusting a motor resistance parameter in an electric motor controller that utilizes the motor resistance parameter in the control of an electric motor used in a vehicle that includes a brake, the method comprising:
    applying power to the electric motor while the vehicle is stopped and the brake is set so that the vehicle remains stopped during a measurement period;
    collecting one or more measurements during the measurement period;
    automatically generating a new motor resistance value based at least in part upon the one or more measurements;
    automatically setting the motor resistance parameter to the new motor resistance value; and
    releasing the brake after the measurements period so that the vehicle may be operated, wherein the new motor resistance parameter is used in the control of the electric motor.

2. A method as recited in claim 1 wherein the electric motor is a brushed permanent magnet DC motor.

3. A method as recited in claim 1 further comprising receiving a brake release request when the vehicle is stopped and the brake is set, wherein the power applying, measurement collecting, motor resistance parameter generating and motor resistance parameter setting steps are performed after receiving the brake release request and before the brake is actually released.

4. A method as recited in claim 1 wherein:
    the power applied to the electric motor while the brake is set is applied by applying voltage in a manner that ramps a current in the motor to a stable current level;
    the measurements are collected after the motor reaches the stable current level; and
    after the measurements are collected, the voltage applied to the motor is reduced such that the current flowing through the motor is reduced prior to releasing the brake.

5. A method as recited in claim 4, wherein the stable current level is in the range of 10 to 30 amps and after the measurements are collected, the current is reduced to zero prior to releasing the brake.

6. A method as recited in claim 1, wherein generating the new motor resistance value includes:
    calculating a measured motor resistance value based on the one or more measurements; and
    the new motor resistance value is based on at least in part upon the measured motor resistance value.

7. A method as recited in claim 6, wherein the new motor resistance value is based on a combination of a plurality of resistance values that include the measured motor resistance value and a present value of the motor resistance parameter.

8. A method as recited in claim 7, wherein the combination is weighted and wherein the weighting of the resistance values depends at least in part on the amount of time that has passed since the present value of the motor resistance parameter was last set.

9. A method as recited in claim 6, wherein:
    the electric motor controller has a minimum permissible resistance value and a maximum permissible resistance value;
    the new motor resistance value is set to the minimum permissible resistance value if the new motor resistance value is less than the minimum permissible resistance value; and
    the new motor resistance value is set to the maximum permissible resistance value if the new motor resistance value is less than the maximum permissible resistance value.

10. The method as recited in claim 6, wherein the new motor resistance value is constrained to a value within a predetermined range relative to a present value of the motor resistance parameter.

11. A motor controller that has a dynamic motor resistance determining mode that operates in accordance with claim 1.

12. An electric motor that includes a motor controller as recited in claim 11.

13. A vehicle having an electric motor as recited in claim 12.

14. A method for dynamically adjusting a motor resistance parameter in an electric motor controller that utilizes the motor resistance parameter in the control of a brushed permanent magnet DC motor used in a vehicle that includes a brake, the method comprising:
    receiving a brake release request when the vehicle is stopped and the brake is set;
    operating the electric motor while holding the brake so that the vehicle remains stopped, wherein the operation is arranged to apply voltage to the motor in a manner that ramps the current in the motor to a stable current level;
    collecting one or more measurements during the operation of the motor after the motor reaches the stable current level while the brake is held and the vehicle remains stopped, wherein after the measurements are collected, the voltage applied to the motor is reduced such that the current flowing through the motor before the brake is actually released;
    automatically generating a new motor resistance value based on the one or more measurements, wherein generating the new motor resistance value includes calculating a measured motor resistance value based on the one or more measurements,
    automatically setting the motor resistance parameter to the new motor resistance value; and
    releasing the brake after the measurements have been taken so that the vehicle may be operated, whereby the new motor resistance parameter is used in the control of the electric motor.

15. A method as recited in claim 14, wherein:
    the new motor resistance value is the weighted combination of a plurality of resistance values that includes the measured motor resistance value and a present value of the motor resistance parameter, wherein the weighting of the resistance values depends at least in part on the amount of time that has passed since the present value of the motor resistance parameter was last set;
    the electric motor controller has a minimum permissible resistance value and a maximum permissible resistance value;
    the new motor resistance value is set to the minimum permissible resistance value if a calculated resistance value is less than the minimum permissible resistance value;

the new motor resistance value is set to the maximum permissible resistance value if the calculated resistance value is greater than the maximum permissible resistance value.

16. An electric motor controller arranged for dynamically adjusting a motor resistance parameter used in the control of an electric motor used in a vehicle that includes a brake, the electric motor controller comprising:
   a brake input indicative of when a user desires to apply the brake and release the brake;
   motor drive circuitry suitable for driving the electric motor;
   an arrangement suitable for collecting one or more measurements during the operation of the motor and automatically generating a new motor resistance value based at least in part upon the one or more measurements, wherein the measurements are made after receiving a brake release signal and before the brake is actually released so that the vehicle remains stopped while the measurements are taken; and
   an arrangement for automatically setting the motor resistance parameter to the new motor resistance value.

17. An electric motor controller as recited in claim 16 wherein the electric motor is a brushed permanent magnet DC motor.

18. An electric motor controller as recited in claim 16 wherein:
   after receiving a brake release signal, voltage is applied to the motor in a manner that ramps the current in the motor to a stable current level;
   the measurements are made after the motor reaches the stable current level; and
   after the measurements are made, the voltage applied to the motor is reduced so that the current flowing through the motor is reduced before the brake is actually released.

19. An electric motor controller as recited in claim 16 wherein the new motor resistance value is based at least in part upon a measured motor resistance value calculated from the one or more measurements.

20. An electric motor controller as recited in claim 16 wherein the new motor resistance value is based on a combination of a plurality of resistance values that include the measured motor resistance value and a present value of the motor resistance parameter.

21. An electric motor controller as recited in claim 20 wherein the combination is weighted and wherein the weighting of the resistance values depends at least in part on the amount of time that has passed since the present value of the motor resistance parameter was last set.

22. An electric motor controller as recited in claim 16 wherein:
   the electric motor controller has a minimum permissible resistance value and a maximum permissible resistance value;
   the new motor resistance value is set to the minimum permissible resistance value if the new motor resistance value is less than the minimum permissible resistance value; and
   the new motor resistance value is set to the maximum permissible resistance value if the new motor resistance value is greater than the maximum permissible resistance value.

23. An electric motor controller as recited in claim 16 wherein the new motor resistance value is constrained to a value within a predetermined range relative to a present value of the motor resistance parameter.

* * * * *